US012665031B2

(12) United States Patent
Dong et al.

(10) Patent No.: US 12,665,031 B2
(45) Date of Patent: Jun. 23, 2026

(54) PROGRAM OPERATIONS IN MEMORY DEVICES

(71) Applicant: Yangtze Memory Technologies Co., Ltd., Wuhan (CN)

(72) Inventors: Zhipeng Dong, Wuhan (CN); Ke Ke, Wuhan (CN); Bo Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 189 days.

(21) Appl. No.: 18/749,538

(22) Filed: Jun. 20, 2024

(65) Prior Publication Data

US 2025/0364052 A1    Nov. 27, 2025

(30) Foreign Application Priority Data

May 27, 2024    (CN) .......................... 202410667405.4

(51) Int. Cl.
| | |
|---|---|
| *G11C 16/10* | (2006.01) |
| *G11C 16/34* | (2006.01) |
| *G11C 16/04* | (2006.01) |

(52) U.S. Cl.
CPC ........ *G11C 16/107* (2013.01); *G11C 16/3459* (2013.01); *G11C 16/0483* (2013.01)

(58) Field of Classification Search
CPC .............. G11C 16/107; G11C 16/3459; G11C 16/0483; G11C 11/5628; G11C 16/10
(Continued)

(56) References Cited

U.S. PATENT DOCUMENTS

2016/0099058 A1 *    4/2016    Yuan .................. G11C 16/0483
365/185.02

FOREIGN PATENT DOCUMENTS

| | | | | |
|---|---|---|---|---|
| CN | 106796817 A | * | 5/2017 | ......... G11C 16/0466 |
| WO | WO-2016057202 A1 | * | 4/2016 | ......... G11C 16/3459 |

* cited by examiner

*Primary Examiner* — Fernando Hidalgo
(74) *Attorney, Agent, or Firm* — Fish & Richardson P.C.

(57) ABSTRACT

Example memory devices, systems, and methods for reducing verify operation time in memory devices are disclosed. One example method includes performing, based on one of $2^N$ pieces of N-bits data, a first programming operation of the target memory cell to program the target memory cell into an intermediate threshold voltage range $$P_1^I$$

of a first set of $2^N - 1$ threshold voltage ranges $$\{P_1^0, P_1^1, \ldots, P_1^{2^N-2}\},$$

where $$P_1^{2^N-2} \text{ and } P_1^{2^N-3}$$

share a same verify voltage. A second programming operation of the target memory cell is performed, based on the one of $2^N$ pieces of N-bits data and the intermediate threshold voltage range $$P_1^I,$$

(Continued)

FIRST PASS 502

SECOND PASS 504

702 ‒ PERFORM, BASED ON ONE OF $2^N$ PIECES OF N-BITS DATA TO BE STORED IN A TARGET MEMORY CELL IN A MEMORY CELL ARRAY, A FIRST PROGRAMMING OPERATION OF THE TARGET MEMORY CELL TO PROGRAM THE TARGET MEMORY CELL INTO AN INTERMEDIATE THRESHOLD VOLTAGE RANGE OF A FIRST SET OF $2^N$-1 THRESHOLD VOLTAGE RANGES, WHERE N IS AN INTEGER GREATER THAN 1, AND A HIGHEST THRESHOLD VOLTAGE RANGE AND A SECOND-HIGHEST THRESHOLD VOLTAGE RANGE OF THE FIRST SET OF $2^N$-1 THRESHOLD VOLTAGE RANGES SHARE A SAME VERIFY VOLTAGE

704 ‒ PERFORM, BASED ON THE INTERMEDIATE THRESHOLD VOLTAGE RANGE, A SECOND PROGRAMMING OPERATION OF THE TARGET MEMORY CELL TO PROGRAM THE TARGET MEMORY CELL INTO ONE OF A SECOND SET OF $2^N$ THRESHOLD VOLTAGE RANGES, WHERE THE SECOND SET OF $2^N$ THRESHOLD VOLTAGE RANGES CORRESPOND TO THE $2^N$ PIECES OF N-BITS DATA RESPECTIVELY, AND THE LOWEST THRESHOLD VOLTAGE RANGE OF THE FIRST SET OF $2^N$-1 THRESHOLD VOLTAGE RANGES CORRESPONDS TO A LOWEST THRESHOLD VOLTAGE RANGE AND A SECOND-LOWEST THRESHOLD VOLTAGE RANGE OF THE SECOND SET OF $2^N$ THRESHOLD VOLTAGE RANGES to program the target memory cell into one of a second set
of $2^N$ threshold voltage ranges $$\left\{ P_2^0, P_2^1, \ldots, P_2^{2^N-1} \right\},$$

where $$\left\{ P_2^0, P_2^1, \ldots, P_2^{2^N-1} \right\}$$

correspond to the $2^N$ pieces of N-bits data respectively, and $$P_1^0$$

corresponds to $$P_2^0 \text{ and } P_2^1.$$

20 Claims, 9 Drawing Sheets

(58) Field of Classification Search
USPC ................................................... 365/185.22
See application file for complete search history.

$P_1^{13}$ $P_1^{14}$

ISPP

Vpv_P13_c                    VERIFY BASED ON Vpv_P13_c

Figure 7:
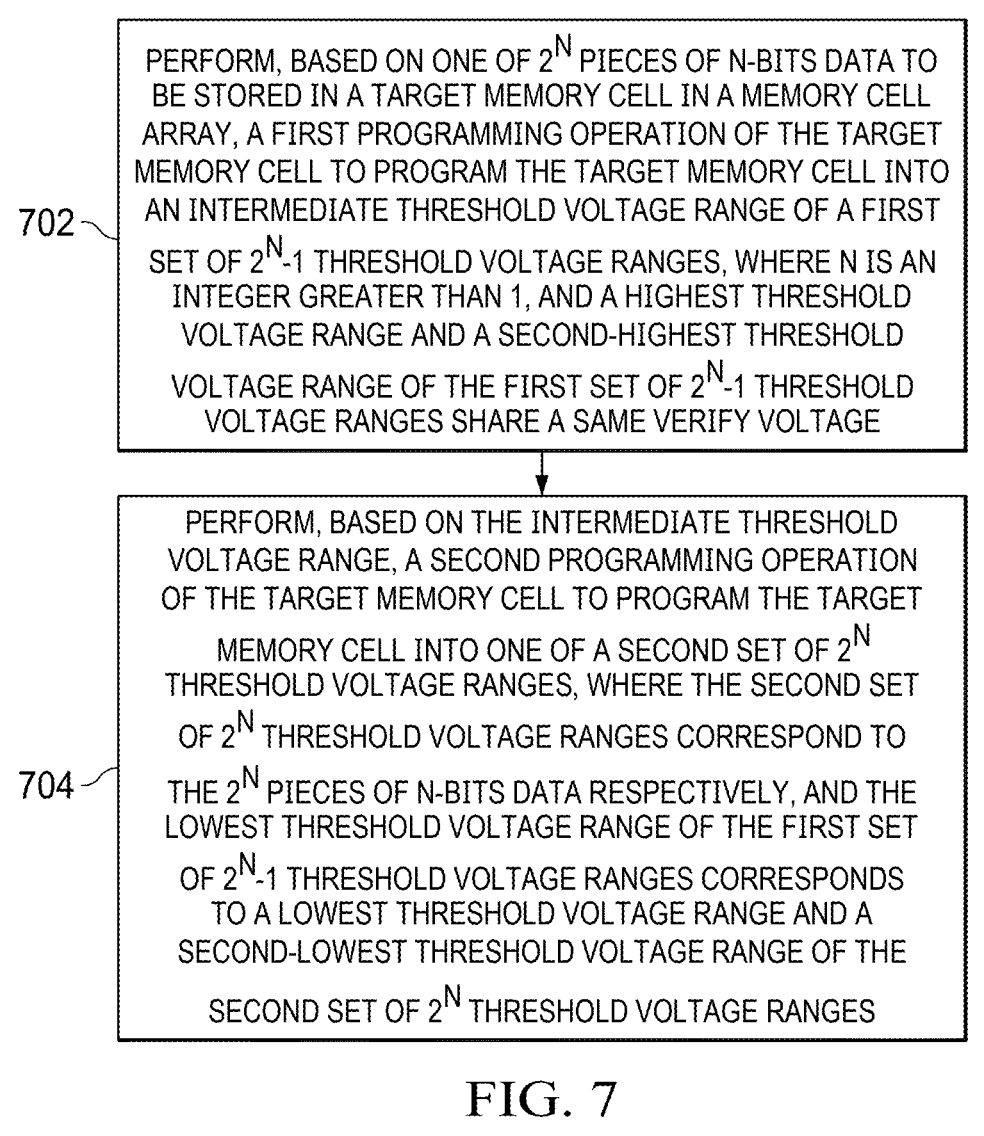

702 — PERFORM, BASED ON ONE OF $2^N$ PIECES OF N-BITS DATA TO BE STORED IN A TARGET MEMORY CELL IN A MEMORY CELL ARRAY, A FIRST PROGRAMMING OPERATION OF THE TARGET MEMORY CELL TO PROGRAM THE TARGET MEMORY CELL INTO AN INTERMEDIATE THRESHOLD VOLTAGE RANGE OF A FIRST SET OF $2^N$-1 THRESHOLD VOLTAGE RANGES, WHERE N IS AN INTEGER GREATER THAN 1, AND A HIGHEST THRESHOLD VOLTAGE RANGE AND A SECOND-HIGHEST THRESHOLD VOLTAGE RANGE OF THE FIRST SET OF $2^N$-1 THRESHOLD VOLTAGE RANGES SHARE A SAME VERIFY VOLTAGE

704 — PERFORM, BASED ON THE INTERMEDIATE THRESHOLD VOLTAGE RANGE, A SECOND PROGRAMMING OPERATION OF THE TARGET MEMORY CELL TO PROGRAM THE TARGET MEMORY CELL INTO ONE OF A SECOND SET OF $2^N$ THRESHOLD VOLTAGE RANGES, WHERE THE SECOND SET OF $2^N$ THRESHOLD VOLTAGE RANGES CORRESPOND TO THE $2^N$ PIECES OF N-BITS DATA RESPECTIVELY, AND THE LOWEST THRESHOLD VOLTAGE RANGE OF THE FIRST SET OF $2^N$-1 THRESHOLD VOLTAGE RANGES CORRESPONDS TO A LOWEST THRESHOLD VOLTAGE RANGE AND A SECOND-LOWEST THRESHOLD VOLTAGE RANGE OF THE SECOND SET OF $2^N$ THRESHOLD VOLTAGE RANGES

MEMORY DEVICE

CONTROLLER

806

904

906

804

MEMORY DEVICE

MEMORY DEVICE

MEMORY DEVICE

MEMORY DEVICE

MEMORY DEVICE

MEMORY DEVICE

CONTROLLER

806

908

1

PROGRAM OPERATIONS IN MEMORY DEVICES

CROSS-REFERENCE TO RELATED APPLICATIONS

This application claims priority to Chinese Patent Application No. 202410667405.4, filed on May 27, 2024, which is hereby incorporated by reference in its entirety.

TECHNICAL FIELD

The present disclosure relates to memory devices, systems, and methods for program operations (also referred to as programming operations) in memory devices.

BACKGROUND

Flash memory is a low-cost, high-density, nonvolatile solid-state storage medium that can be electrically erased and reprogrammed. Flash memory includes NOR flash memory and NAND flash memory. Various operations can be performed by a flash memory, for example, program (write) and erase operations, to change the threshold voltage of each memory cell to a respective level. For NAND flash memory, an erase operation can be performed at the block level.

SUMMARY

The present disclosure relates to memory devices, systems, and methods for erase operations in memory devices.

Certain aspects of the subject matter described here can be implemented as a method. The method includes performing, based on one of $2^N$ pieces of N-bits data to be stored in a target memory cell in a memory cell array, a first programming operation of the target memory cell to program the target memory cell into an intermediate threshold voltage range $$P_1^I$$

of a first set of $2^N-1$ threshold voltage ranges $$\left\{ P_1^0, P_1^1, \ldots, P_1^{2^N-2} \right\},$$

where N is an integer greater than 1, and a highest threshold voltage range $$P_1^{2^N-2}$$

and a second-highest threshold voltage range $$P_1^{2^N-3}$$

of the first set of $2^N-1$ threshold voltage ranges share a same verify voltage. A second programming operation of the target memory cell is performed, based on the one of $2^N$ pieces of N-bits data and the intermediate threshold voltage range $$P_1^I,$$

to program the target memory cell into one of a second set of $2^N$ threshold voltage ranges $$\left\{ P_2^0, P_2^1, \ldots, P_2^{2^N-1} \right\},$$

where the second set of $2^N$ threshold voltage ranges $$\left\{ P_2^0, P_2^1, \ldots, P_2^{2^N-1} \right\}$$

correspond to the $2^N$ pieces of N-bits data respectively, and the lowest threshold voltage range $$P_1^0$$

of the first set of $2^N-1$ threshold voltage ranges corresponds to a lowest threshold voltage range $$P_2^0$$

and a second-lowest threshold voltage range $$P_2^1$$

of the second set of $2^N$ threshold voltage ranges.

The method can include one or more of the following features.

In some implementations, the intermediate threshold voltage $$P_1^I$$

is the lowest threshold voltage range $$P_1^0$$

of the first set of $2^N-1$ threshold voltage ranges $$\left\{ P_1^0, P_1^1, \ldots, P_1^{2^N-2} \right\},$$

and performing, based on the intermediate threshold voltage range $$P_1^I,$$

operation of the target memory cell to program the target memory cell into one of a second set of $2^N$ threshold voltage ranges $$\left\{P_2^0, P_2^1, \dots, P_2^{2^N-1}\right\}$$

includes performing, based on the intermediate threshold voltage range $$P_1^I,$$

the second programming operation of the target memory cell to program the target memory cell into the second-lowest threshold voltage range $$P_2^1$$

set of $2^N$ threshold voltage ranges $$\left\{P_2^0, P_2^1, \dots, P_2^{2^N-1}\right\}.$$

In some implementations, the intermediate threshold voltage $$P_1^I$$

is a lowest threshold voltage range $$P_1^0$$

of the first set of $2^N-1$ threshold voltage ranges $$\left\{P_1^0, P_1^1, \dots, P_1^{2^N-2}\right\},$$

performing, based on the intermediate threshold voltage range $$P_1^I,$$

the second programming operation of the target memory cell to program the target memory cell into one of a second set of $2^N$ threshold voltage ranges $$\left\{P_2^0, P_2^1, \dots, P_2^{2^N-1}\right\}$$

includes performing, based on the intermediate threshold voltage range $$P_1^I,$$

the second programming operation of the target memory cell to program the target memory cell into the lowest threshold voltage range $$P_2^0$$

of the second set of $2^N$ threshold voltage ranges $$\left\{P_2^0, P_2^1, \dots, P_2^{2^N-1}\right\},$$

and both the lowest threshold voltage range $$P_1^0$$

of the first set of $2^N-1$ threshold voltage ranges $$\left\{P_1^0, P_1^1, \dots, P_1^{2^N-2}\right\}$$

and the lowest threshold voltage range $$P_2^0$$

of the second set of $2^N$ threshold voltage ranges correspond to an erased state of the target memory cell.

In some implementations, $$\left\{P_1^1, P_1^2, \dots, P_1^{2^N-2}\right\}$$

of the first set of $2^N-1$ threshold voltage ranges corresponds to $$\left\{P_2^2, P_2^3, \dots, P_2^{2^N-1}\right\}$$

of the second set of $2^N$ threshold voltage ranges respectively.

In some implementations, performing the first programming operation includes performing a first incremental step pulse programming (ISPP) based on a first programming voltage step, the intermediate threshold voltage range $$P_1^I$$

is the highest threshold voltage range $$P_1^{2^N-2}$$

of the first set of $2^N - 1$ threshold voltage ranges $$\left\{ P_1^0, P_1^1, \ldots, P_1^{2^N - 2} \right\},$$

and the method includes verifying the target memory cell is within the highest threshold voltage range $$P_1^{2^N - 2}$$

of the first set of $2^N - 1$ threshold voltage ranges $$\left\{ P_1^0, P_1^1, \ldots, P_1^{2^N - 2} \right\}$$

using a verily voltage $$V_1^{2^N - 3},$$

and in response to verifying the target memory cell is within the highest threshold voltage range $$P_1^{2^N - 2}$$

of the first set of $2^N - 1$ threshold voltage ranges $$\left\{ P_1^0, P_1^1, \ldots, P_1^{2^N - 2} \right\}$$

voltage $$V_1^{2^N - 3},$$

applying a programming pulse in the first ISPP to a word line coupled to the target memory cell, and applying an inhibit voltage to a bit line coupled to the target memory cell to inhibit an additional programming operation on the target memory cell.

In some implementations, applying the programming pulse in the first ISPP to the word line coupled to the target memory cell includes applying the programming pulse with the first programming voltage step based on a difference between the highest threshold voltage range $$P_1^{2^N - 2}$$

and the second-highest threshold voltage range $$P_1^{2^N - 3}$$

in the first ISPP to the word line coupled to the target memory cell.

In some implementations, performing the second programming operation includes performing a second ISPP based on a second programming voltage step that is smaller than the first programming voltage step, and performing the second ISPP to program the target memory cell into the highest threshold voltage range $$P_2^{2^N - 1}$$

of the second set of $2^N$ threshold voltage ranges $$\left\{ P_2^0, P_2^1, \ldots, P_2^{2^N - 1} \right\}$$

includes applying a programming pulse in the second ISPP to a word line coupled to the target memory cell, and applying a second inhibit voltage to the bit line coupled to the target memory cell to inhibit another programming operation on the target memory cell.

In some implementations, N=4.

In some implementations, a threshold voltage within $$P_1^1$$

is higher than or equal to a threshold voltage within $$P_2^1.$$

In some implementations, a threshold voltage within $$P_1^{2^N - 2}$$

is lower than a threshold voltage within $$P_2^{2^N - 1}.$$

Certain aspects of the subject matter described here can be implemented as a memory device. The memory device includes a memory cell array and a peripheral circuit coupled to the memory cell array and configured to perform operations including performing, based on one of $2^N$ pieces of N-bits data to be stored in a target memory cell in a memory cell array, a first programming operation of the target memory cell to program the target memory cell into an intermediate threshold voltage range $$P_1^I$$

of a first set of $2^N - 1$ threshold voltage ranges $$\left\{ P_1^0, P_1^1, \ldots, P_1^{2^N - 2} \right\},$$

7 where N is an integer greater than 1, and a highest threshold voltage range $$P_1^{2^N-2}$$

second-highest threshold voltage range $$P_1^{2^N-3}$$

of the first set of $2^N-1$ threshold voltage ranges share a same verify voltage. A second programming operation of the target memory cell is performed, based on the one of $2^N$ pieces of N-bits data and the intermediate threshold voltage range $$P_1^I,$$

to program the target memory cell into one of the second set of $2^N$ threshold voltage ranges $$\left\{P_2^0, P_2^1, \dots, P_2^{2^N-1}\right\},$$

where the second set of $2^N$ threshold voltage ranges $$\left\{P_2^0, P_2^1, \dots, P_2^{2^N-1}\right\}$$

correspond to the $2^N$ pieces of N-bits data respectively, and the lowest threshold voltage range $$P_1^0$$

of the first set of $2^N-1$ threshold voltage ranges corresponds to a lowest threshold voltage range $$P_2^0$$

and a second-lowest threshold voltage range $$P_2^1$$

of the second set of $2^N$ threshold voltage ranges.

The memory device can include one or more of the following features.

In some implementations, the intermediate threshold voltage range $$P_1^I$$

8 threshold voltage range $$P_1^0$$

of the first set of $2^N-1$ threshold voltage ranges $$\left\{P_1^0, P_1^1, \dots, P_1^{2^N-2}\right\},$$

and performing, based on the intermediate threshold voltage range $$P_1^I,$$

operation of the target memory cell to program the target memory cell into one of a second set of $2^N$ threshold voltage ranges $$\left\{P_2^0, P_2^1, \dots, P_2^{2^N-1}\right\}$$

includes performing, based on the intermediate threshold voltage range $$P_1^I,$$

the second programming operation of the target memory cell to program the target memory cell into the second-lowest threshold voltage range $$P_2^1$$

of the second set of $2^N$ threshold voltage ranges $$\left\{P_2^0, P_2^1, \dots, P_2^{2^N-1}\right\}.$$

In some implementations, the intermediate threshold voltage range $$P_1^I$$

is a lowest threshold voltage range $$P_1^0$$

of the first set of $2^N-1$ threshold voltage ranges $$\left\{P_1^0, P_1^1, \dots, P_1^{2^N-2}\right\},$$

performing, based on the intermediate threshold voltage range $$P_1^I,$$

the second programming operation of the target memory cell to program the target memory cell into one of a second set of $2^N$ threshold voltage ranges $$\left\{ P_2^0, P_2^1, \ldots, P_2^{2^N-1} \right\}$$

includes performing, based on the intermediate threshold voltage range $$P_1^I,$$

the second programming operation of the target memory cell to program the target memory cell into the lowest threshold voltage range $$P_2^0$$

of the second set of $2^N$ threshold voltage ranges $$\left\{ P_2^0, P_2^1, \ldots, P_2^{2^N-1} \right\},$$

and both the lowest threshold voltage range $$P_1^0$$

of the first set of $2^N-1$ threshold voltage ranges $$\left\{ P_1^0, P_1^1, \ldots, P_1^{2^N-2} \right\}$$

and the lowest threshold voltage range $$P_2^0$$

of the second set of $2^N$ threshold voltage ranges correspond to an erased state of the target memory cell.

In some implementations, $$\left\{ P_1^1, P_1^2, \ldots, P_1^{2^N-2} \right\}$$

of the first set of $2^N-1$ threshold voltage ranges corresponds to $$\left\{ P_2^2, P_2^3, \ldots, P_2^{2^N-1} \right\}$$

of the second set of $2^N$ threshold voltage ranges respectively.

In some implementations, performing the first programming operation includes performing a first incremental step pulse programming (ISPP) based on a first programming voltage step, the intermediate threshold voltage range $$P_1^I$$

is the highest threshold voltage range $$P_1^{2^N-2}$$

of the first set of $2^N-1$ threshold voltage ranges $$\left\{ P_1^0, P_1^1, \ldots, P_1^{2^N-2} \right\},$$

and the operations include verifying the target memory cell is within the highest threshold voltage range $$P_1^{2^N-2}$$

of the first set of $2^N-1$ threshold voltage ranges $$\left\{ P_1^0, P_1^1, \ldots, P_1^{2^N-2} \right\}$$

using the verify voltage $$V_1^{2^N-3},$$

and in response to verifying the target memory cell is within the highest threshold voltage range $$P_1^{2^N-2}$$

of the first set of $2^N-1$ threshold voltage ranges $$\left\{ P_1^0, P_1^1, \ldots, P_1^{2^N-2} \right\}$$

using the verify voltage $$V_1^{2^N-3},$$

applying a programming purse in the first ISPP to a word line coupled to the target memory cell, and applying an inhibit voltage to a bit line coupled to the target memory cell to inhibit an additional programming operation on the target memory cell.

In some implementations, applying the programming pulse in the first ISPP to the word line coupled to the target memory cell includes applying the programming pulse with the first programming voltage step based on a difference between the highest threshold voltage range $$P_1^{2^N-2}$$

and the second-highest threshold voltage range $$P_1^{2^N-3}$$

in the first ISPP to the word line coupled to the target memory cell.

In some implementations, performing the second programming operation includes performing a second ISPP based on a second programming voltage step that is smaller than the first programming voltage step, and performing the second ISPP to program the target memory cell into the highest threshold voltage range $$P_2^{2^N-1}$$

of the second set of $2^N$ threshold voltage ranges $$\left\{P_2^0, P_2^1, \dots, P_2^{2^N-1}\right\}$$

includes applying a programming pulse in the second ISPP to a word line coupled to the target memory cell, and applying a second inhibit voltage to the bit line coupled to the target memory cell to inhibit another programming operation on the target memory cell.

In some implementations, N=4.

In some implementations, a threshold voltage $$P_1^1$$

is higher than or equal to a threshold voltage within $$P_2^1.$$

In some implementations, a threshold voltage within $$P_1^{2^N-2}$$

is lower than a thresnold voltage within $$P_2^{2^N-1}.$$

Certain aspects of the subject matter described here can be implemented as a memory system. The memory system includes a memory device and a controller coupled to the memory device and configured to initiate operations. The memory device includes a memory cell array and a peripheral circuit coupled to the memory cell array and configured to perform the operations including performing, based on one of $2^N$ pieces of N-bits data to be stored in a target memory cell in a memory cell array, a first programming operation of the target memory cell to program the target memory cell into an intermediate threshold voltage range $$P_1^I$$

of the first set of $2^N-1$ threshold voltage ranges $$\left\{P_1^0, P_1^1, \dots, P_1^{2^N-2}\right\},$$

where N is an integer greater than 1, and a highest threshold voltage range $$P_1^{2^N-2}$$

and a second-highest threshold voltage range $$P_1^{2^N-3}$$

of the first set of $2^N-1$ threshold voltage ranges share a same verify voltage. A second programming operation of the target memory cell is performed, based on the one of $2^N$ pieces of N-bits data and the intermediate threshold voltage range $$P_1^I,$$

to program un larger memory cell into one of a second set of $2^N$ threshold voltage ranges $$\left\{P_2^0, P_2^1, \dots, P_2^{2^N-1}\right\},$$

where the second set of $2^N$ threshold voltage ranges $$\left\{P_2^0, P_2^1, \dots, P_2^{2^N-1}\right\}$$

correspond to the $2^N$ pieces of N-bits data respectively, and the lowest threshold voltage range $$P_1^0$$

of the first set of $2^N-1$ threshold voltage ranges corresponds to a lowest threshold voltage range $$P_2^0$$

and a second-lowest threshold voltage range $$P_2^1$$

of the second set of $2^N$ threshold voltage ranges.

The memory system can include one or more of the following features.

In some implementations, the intermediate threshold voltage range $$P_1^I$$

is the lowest threshold voltage range $$P_1^0$$

of the first set of $2^N-1$ threshold voltage ranges $$\{P_1^0, P_1^1, ..., P_1^{2^N-2}\},$$

and performing, based on the intermediate threshold voltage range $$P_1^I,$$

the second programming operation of the target memory cell to program the target memory cell into one of a second set of $2^N$ threshold voltage ranges $$\{P_2^0, P_2^1, ..., P_2^{2^N-1}\}$$

includes performing, based on the intermediate threshold voltage range $$P_1^I,$$

the second programming operation of the target memory cell to program the target memory cell into the second-lowest threshold voltage range $$P_2^1$$

of the second set of $2^N$ threshold voltage ranges $$\{P_2^0, P_2^1, ..., P_2^{2^N-1}\}.$$

In some implementations, the intermediate threshold voltage range $$P_1^I$$

is a lowest threshold voltage range $$P_1^0$$

of the first set of $2^N-1$ threshold voltage ranges $$\{P_1^0, P_1^1, ..., P_1^{2^N-2}\},$$

performing, based on the intermediate threshold voltage range $$P_1^I,$$

the second programming operation of the target memory cell to program the target memory cell into one of a second set of $2^N$ threshold voltage ranges $$\{P_2^0, P_2^1, ..., P_2^{2^N-1}\}.$$

including performing, based on the intermediate threshold voltage range $$P_1^I,$$

the second programming operation of the target memory cell to program the target memory cell into the lowest threshold voltage range $$P_2^0$$

of the second set of $2^N$ threshold voltage ranges $$\{P_2^0, P_2^1, ..., P_2^{2^N-1}\},$$

and both the lowest threshold voltage range $$P_1^0$$

of the first set of $2^N-1$ threshold voltage ranges $$\{P_1^0, P_1^1, ..., P_1^{2^N-2}\}$$

15 and the lowest threshold voltage range $$P_2^0$$

of the second set of $2^N$ threshold voltage ranges correspond to an erased state of the target memory cell.

In some implementations, $$\{P_1^1, P_1^2, \dots, P_1^{2^N-2}\}$$

of the first set of $2^N-1$ threshold voltage ranges corresponds to $$\{P_2^2, P_2^3, P_2^{2^N-1}\}$$

of the second set of $2^N$ threshold voltage ranges respectively.

In some implementations, performing the first programming operation includes performing a first incremental step pulse programming (ISPP) based on a first programming voltage step, the intermediate threshold voltage range $$P_1^I$$

is the highest threshold voltage range $$P_1^{2^N-2}$$

of the first set of $2^N-1$ threshold ranges $$\{P_1^0, P_1^1, \dots, P_1^{2^N-2}\},$$

and the operations include verifying the target memory cell is within the highest threshold voltage range $$P_1^{2^N-2}$$

of the first set of $2^N-1$ threshold voltage ranges $$\{P_1^0, P_1^1, \dots, P_1^{2^N-2}\}$$

using the verify voltage $$V_1^{2^N-3},$$

16 and in response to verifying the target memory cell is within the highest threshold voltage range $$P_1^{2^N-2}$$

of the first set of $2^N-1$ threshold voltage ranges $$\{P_1^0, P_1^1, \dots, P_1^{2^N-2}\}$$

using the verify voltage $$V_1^{2^N-3},$$

applying a programming pulse in the first ISPP to a word line coupled to the target memory cell, and applying an inhibit voltage to a bit line coupled to the target memory cell to inhibit an additional programming operation on the target memory cell.

In some implementations, applying the programming pulse in the first ISPP to the word line coupled to the target memory cell includes applying the programming pulse with the first programming voltage step based on a difference between the highest threshold voltage range $$P_1^{2^N-2}$$

and the second-highest voltage range $$P_1^{2^N-3}$$

in the first ISPP to the word line coupled to the target memory cell.

In some implementations, performing the second programming operation includes performing a second ISPP based on a second programming voltage step that is smaller than the first programming voltage step, and performing the second ISPP to program the target memory cell into the highest threshold voltage range $$P_2^{2^N-1}$$

of the second set of $2^N$ threshold voltage ranges $$\{P_2^0, P_2^1, \dots, P_2^{2^N-1}\}$$

includes applying a programming pulse in the second ISPP to a word line coupled to the target memory cell, and applying a second inhibit voltage to the bit line coupled to the target memory cell to inhibit another programming operation on the target memory cell.

In some implementations, N=4.

In some implementations, a threshold voltage within $$P_1^1$$

is higher than or equal to a threshold voltage within $$P_2^1.$$

In some implementations, a threshold voltage within $$P_1^{2^N-2}$$

is lower than a threshold voltage within $$P_2^{2^N-1}.$$

The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 7 is a flow chart of an example process for reducing verify operation time in a memory device, according to some aspects of the present disclosure.

Like reference numbers and designations in the various drawings indicate like elements.

DETAILED DESCRIPTION

Figure 1:
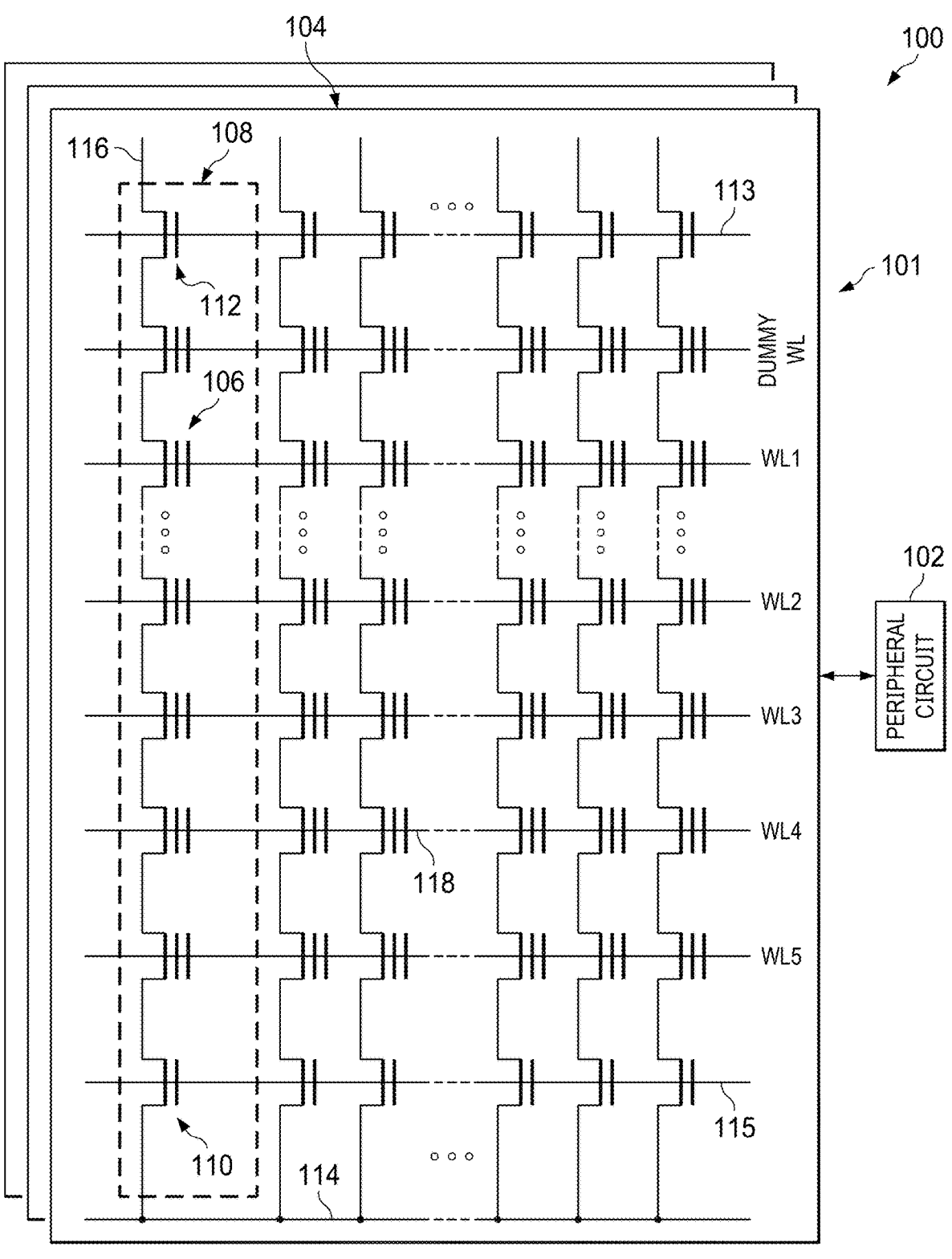
FIG. 1 illustrates an example of a schematic circuit diagram of a memory device including peripheral circuits, according to some aspects of the present disclosure.

This specification relates to memory devices, systems, and methods for improving program operations of memory devices, for example, by reducing program and/or verify operation (also referred to as verifying operation) time in program operations of the memory devices. In some cases, memory devices, such as NAND flash memory devices, can store more than a single bit of information into each memory cell in multiple levels (i.e., states) in order to increase the storage capacity and reduce the cost per bit. In program operations, data may be programmed (written) into xLCs, such as multi-level cells (MLCs), triple-level cells (TLCs), and quad-level cells (QLCs). For xLCs, multi-pass program operations can be used to increase read margin. For example, the multi-pass program operations can involve a coarse program pass that programs the xLCs to one of multiple intermediate levels, as well as a fine program pass that programs the xLCs from the intermediate levels to corresponding final levels. For example, for a QLC configured to store N=4 bit of data, a scheme of two-pass program operations can be a $2^N$-$2^N$ (16-16) scheme in which the memory cells are first programmed to one of 16 levels in the coarse programming (a non-last program pass), and then programmed to 16 final levels in the fine programming (a later program pass). In some cases, the 16-16 scheme can be associated with a large number of programming pulses (also referred to as programming pulse counts) and a large number of verify pulses (also referred to as verify counts). These programming pulse counts and verify counts can lead to long programming time.

In some implementations, to reduce the programming time of a multi-pass program operation, example techniques are described to reduce the programming pulse counts and verify counts, for example, by reducing the number of the intermediate levels and/or sharing a verify operation in a non-last program pass. For example, to program a memory cell to store a N-bit data using a multi-pass program operation, the number of the intermediate levels in a non-last program pass can be reduced from $2^N$, for example, to $(2^N-1)$ intermediate levels. As such, instead of performing a $2^N$-$2^N$ two-pass program operation, a $(2^N-1)$-$2^N$ two-pass program operation can be performed. In some implementations, the number of programming pulses in the non-last program pass is achieved by combining a threshold voltage range of an erase state and a threshold voltage range of a programming state in a first pass of the $2^N$-$2^N$ two-pass program operation into a single one threshold voltage range (e.g., a threshold voltage range of an erase state) of the first pass of the $(2^N-1)$-$2^N$ two-pass program operation. In a later program pass (e.g., the final program pass) of the $(2^N-1)$-$2^N$ two-pass program operation, the single one threshold voltage range can be split into a threshold voltage range of an erase state and a threshold voltage range of a programming state of the later program pass of the $(2^N-1)$-$2^N$ two-pass program operation.

Furthermore, the highest and the second highest threshold voltage ranges in a non-last program pass or a later program pass can share the same bit line voltage and the same verify voltage. Additionally, the highest and the second highest threshold voltage ranges in a non-last program pass can share a verify operation, therefore reducing the number of verify pulses during the non-last program pass.

Implementations of the present disclosure can provide one or more of the following technical effects. For example, the number of programming pulses in a non-last program pass of a multi-pass program operation can be reduced, therefore leading to reduced programming time. Furthermore, the number of verify pulses in a non-last program pass or a later program pass of a multi-pass program operation can be reduced, also leading to reduced programming time. As an example, for QLC, the programming algorithm can be redesigned accordingly to achieve a saving of one programming pulse and a number of verify counts during a non-last program pass. In some implementations, the described techniques can save programming time with little Esum loss. In some implementations, the described techniques can achieve a reduced programming time without the need of extra latches for non-last program pass.

FIG. 1 illustrates an example of a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1 each NAND memory string 108 can include a source select gate (SSG) 110 at its source end and a drain select gate (DSG) 112 at its drain end. SSG 110 and DSG 112 can be configured to activate selected NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. DSG 112 of each NAND memory string 108 is coupled to a respective bit line 116 from which data can be read or written via an output bus (not shown), according to some implementations. In some implementations, each NAND memory string 108 is configured to be selected or deselected by applying a select voltage or a deselect voltage (e.g., 0 V) to respective DSG 112 through one or more DSG lines 113, and/or by applying a select voltage or a deselect voltage (e.g., 0 V) to respective SSG 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a selected block 104, source lines 114 coupled to selected block 104 as well as unselected blocks 104 in the same plane as selected block 104 can be biased with an erase voltage (Vers), such as a high positive voltage (e.g., 20 V or more). In some examples, erase operation may be performed at a half-block level, a quarter-block level, or a level having any suitable number of blocks or any suitable fractions of a block. Memory cells 106 of adjacent NAND memory strings can be coupled through word lines 118 that select which row of memory cells 106 is affected by read and program operations. Each word line 118 can include a plurality of control gates (gate electrodes) at each memory cell 106 and a gate line coupling the control gates. Example word lines (WLs) shown in FIG. 1 include dummy WL, WL1, WL2, WL3, WL4, and WL5 that are between one or more DSG lines 113 and one or more SSG lines 115.

Figure 2:
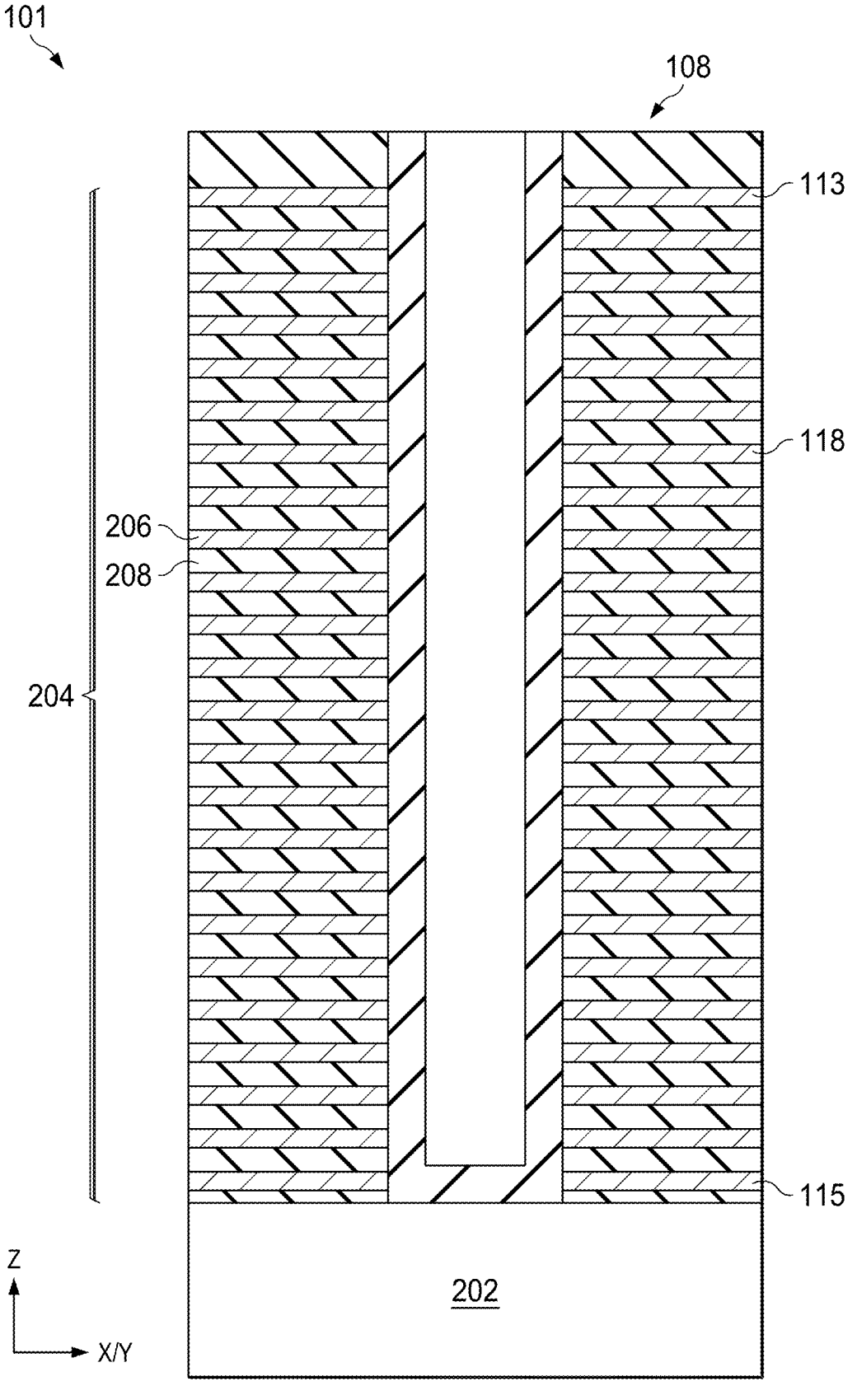
FIG. 2 illustrates an example of a side view of cross-sections of a memory cell array including NAND memory strings, according to some aspects of the present disclosure.

FIG. 2 illustrates an example of a side view of cross-sections of a memory cell array 101 including NAND memory strings 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding the memory cells 106, DSG 112, or SSG 110, and can extend laterally as DSG line 113 at the top of memory stack 204, SSG line 115 at the bottom of memory stack 204, or word line 118 between DSG line 113 and SSG line 115.

Figure 3:
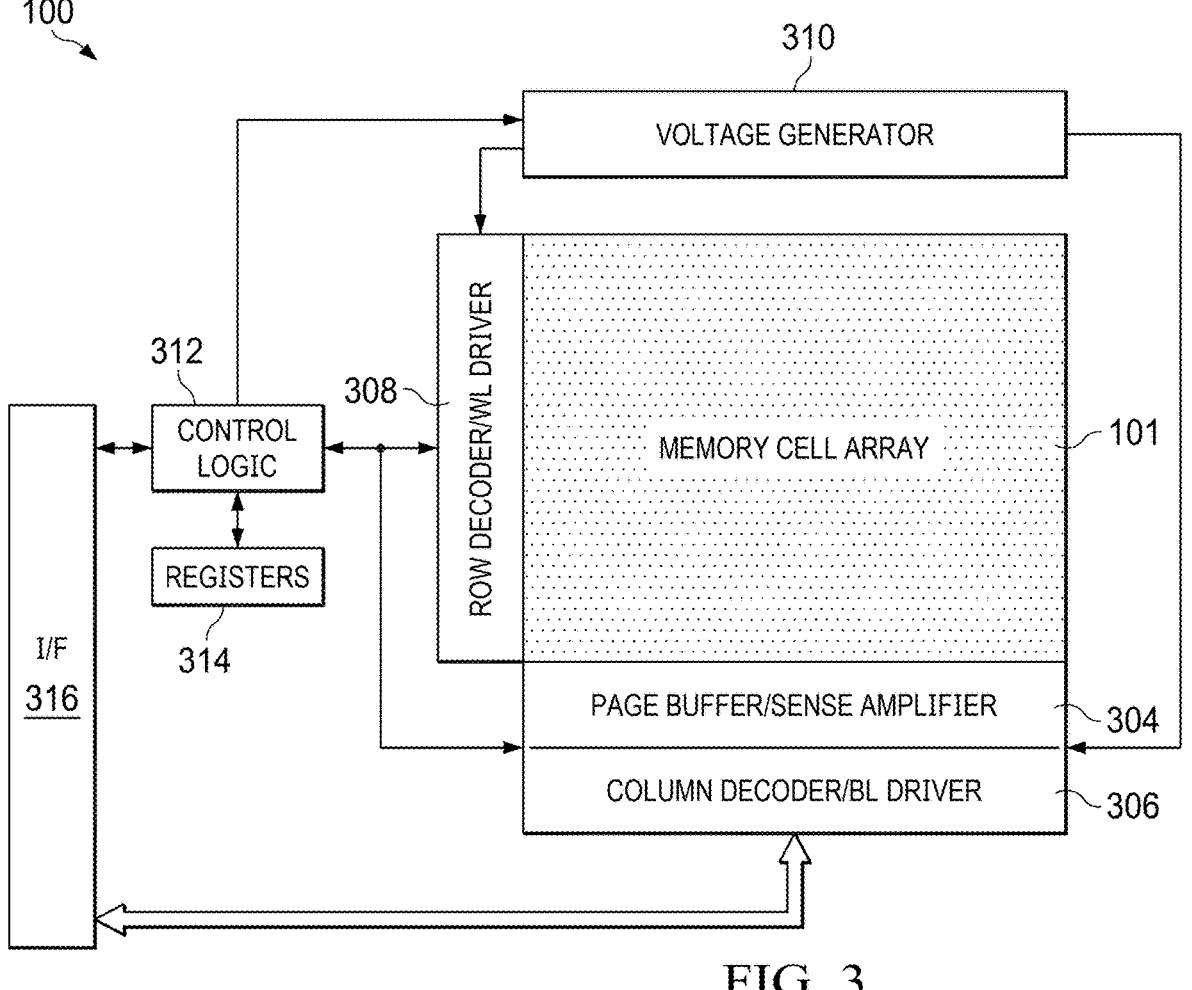
FIG. 3 illustrates an example of transactions between a host and a device, according to some aspects of the present disclosure.

Peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each target memory cell of the memory cells 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some example peripheral circuits, according to some aspects of the present disclosure. The example peripheral circuits include a page buffer/sense amplifier 304, a column decoder/bit line driver 306, a row decoder/word line driver 308, a voltage generator 310, control logic 312, registers 314, an interface 316, and a data bus. In some examples, additional peripheral circuits not shown in FIG. 3 may be included as well.

Page buffer/sense amplifier 304 can be configured to read and program (write) data from and to memory cell array 101 according to the control signals from control logic 312. In one example, page buffer/sense amplifier 304 may store one page of program data (write data) to be programmed into one page of memory cell array 101. In another example, page buffer/sense amplifier 304 may perform program verify operations to ensure that the data has been properly programmed into memory cells 106 coupled to selected word lines 118. In still another example, page buffer/sense amplifier 304 may also sense the low power signals from bit line 116 that represents a data bit stored in memory cell 106 and amplify the small voltage swing to recognizable logic levels in a read operation. Column decoder/bit line driver 306 can be configured to be controlled by control logic 312 and select one or more NAND memory strings 108 by applying bit line voltages generated from voltage generator 310.

Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. Row decoder/word line driver 308 can be configured to apply a read voltage to selected word line 118 in a read operation on memory cell 106 coupled to selected word line 118.

Voltage generator 310 can be configured to be controlled by control logic 312 and generate the word line voltages (e.g., read voltage, program voltage, pass voltage, local voltage, verification voltage, etc.), bit line voltages, and source line voltages to be supplied to memory cell array 101.

Control logic 312 can be coupled to each peripheral circuit described above and configured to control operations of each peripheral circuit. Registers 314 can be coupled to control logic 312 and include status registers, command registers, and address registers for storing status information, command operation codes (OP codes), and command addresses for controlling the operations of each peripheral circuit. The status registers of registers 314 can include one or more registers configured to store open block information indicative of the open block(s) of all blocks 104 in memory cell array 101, such as having an auto dynamic start voltage (ADSV) list. In some implementations, the open block information is also indicative of the last programmed page of each open block.

Interface 316 can be coupled to control logic 312 and act as a control buffer to buffer and relay control commands received from a host (not shown) to control logic 312 and status information received from control logic 312 to the host. Interface 316 can also be coupled to column decoder/ bit line driver 306 via a data bus and act as a data input/ output (I/O) interface and a data buffer to buffer and relay data to and from memory cell array 101.

Figure 4:
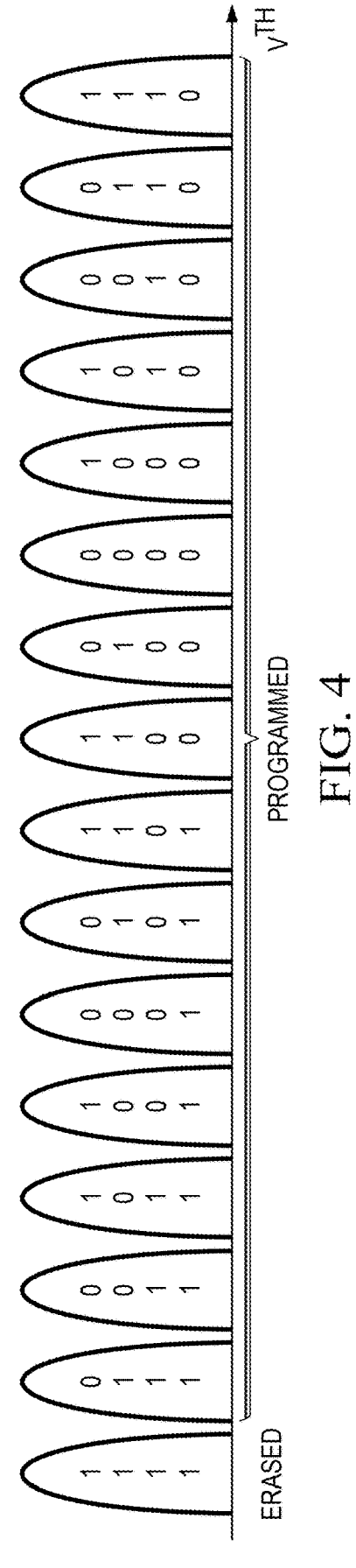
FIG. 4 illustrates example threshold voltage distributions of memory cells in a program operation, according to some aspects of the present disclosure.

FIG. 4 illustrates example threshold voltage distributions of memory cells in a program operation, according to some aspects of the present disclosure. In some implementations, each memory cell 106 can be configured to store a piece of N-bits data in one of $2^N$ levels, where N is an integer greater than 1 (e.g., N=2 for MLCs, N=3 for TLCs, and N=4 for QLCs). Each level can correspond to one of $2^N$ threshold voltage (Vth) ranges of memory cells 106. For a multi-pass program operation in which memory cell 106 may be programmed into an intermediate level first in a coarse program pass (a non-last program pass), and then from the intermediate level to a final level after the fine program pass (the last program pass) of the multi-pass program operations. Taking QLCs, where N=4, for example, as shown in FIG. 4, memory cell 106 may be programmed into one of the $2^N=16$ levels, including one level of an erased state and 15 levels of programmed states. Each level may correspond to a respective threshold voltage (Vth) range of memory cells 106. For example, the level corresponding to the lowest threshold voltage range (the left-most threshold voltage distribution in FIG. 4) may be considered as level 0, the level corresponding to the second-lowest threshold voltage range (the second left-most threshold voltage distribution in FIG. 4) may be considered as level 1, and so on until level 15 corresponding to the highest threshold voltage range (the right-most threshold voltage distribution in FIG. 4).

In some implementations, each of the 2 levels can correspond to one of the 24 pieces of N-bits data that is to be stored in target memory cell 106. In some cases, the 24 pieces of N-bits data may be represented, for example, by (in the form of) a gray code. A gray code (a.k.a., reflected binary code (RBC) or reflected binary (RB)) is an ordering of the binary numeral system such that two successive values differ in only one bit (binary digit). For example, Table 1 below shows an example of a binary code representing a one-to-one mapping between 16 levels (level 0 to level 15) and 16 pieces of 4-bit data used in the example of FIG. 4. As shown in Table 1, each piece of 4-bits data may consist of four bits of binary values (b1, b2, b3, and b4). In one example, level 1 may correspond to a piece of 4-bits data having a value of 1111. In another example, level 15 may correspond to another piece of 4-bits data having a value of 1110.

TABLE 1

| Level | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| b1 | 1 | 0 | 0 | 0 | 1 | 1 | 0 | 0 | 0 | 0 | 0 | 1 | 1 | 1 | 1 | 1 |
| b2 | 1 | 1 | 1 | 0 | 0 | 0 | 0 | 1 | 1 | 0 | 0 | 0 | 0 | 1 | 1 | 1 |
| b3 | 1 | 1 | 1 | 1 | 1 | 0 | 0 | 0 | 0 | 0 | 1 | 1 | 0 | 0 | 0 | 1 |
| b4 | 1 | 1 | 0 | 0 | 1 | 0 | 0 | 0 | 1 | 1 | 1 | 1 | 1 | 1 | 0 | 0 |

Figure 5:
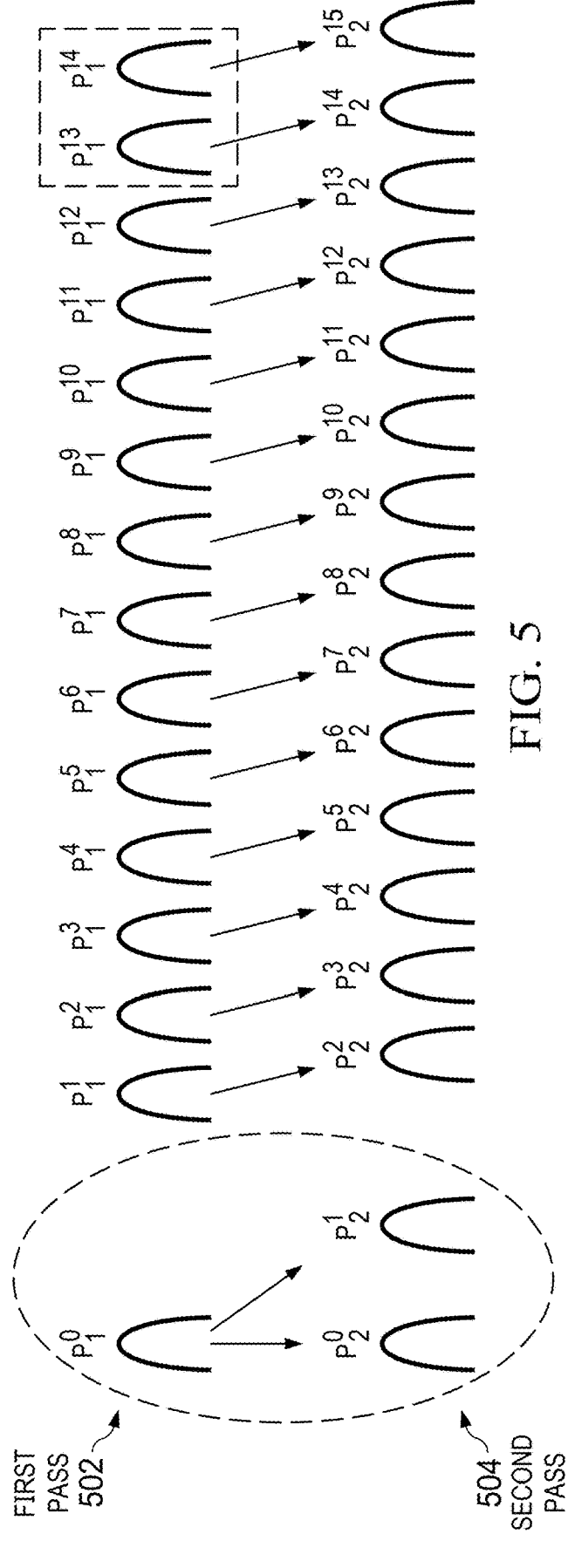
FIG. 5 illustrates example threshold voltage ranges associated with a multi-pass programming operation, according to some aspects of the present disclosure.

FIG. 5 illustrates example threshold voltage ranges associated with a multi-pass programming operation, according to some aspects of the present disclosure.

In some implementations, to perform a program operation to write one of 24 pieces of N-bits data into a target memory cell (e.g., memory cell 106), row decoder/word line driver 308 can be configured to apply program voltages and verify voltages to a selected word line 118 in one or more program/ verify loops, in order to raise the threshold voltage of target memory cell 106 to a desired level (into a desired range of threshold voltages) based on the piece of N-bits data. N is an integer greater than 1, and the selected word line 118 is coupled to target memory cell 106.

In some implementations, a multi-pass program operation performed on a target memory cell 106 can include at least a first pass 502 (e.g., a coarse program pass, a non-last program pass, or a first programming operation) and a second pass 504 (e.g., a fine program pass, the last program pass, or a second programming operation) after first pass 502. First pass 502 and second pass 504 can each include one or more program/verify loops. Each program/verify loop can include one or more programming pulses/operations, followed by one or more verify pulses/operations, regardless of whether it is in first pass 502 or second pass 504. The programming pulses and the verify pulses can use incrementally changing voltage levels, for example, based on incremental step pulse programming (ISPP). The programming voltage can be applied to a selected word line 118 coupled to target memory cell 106. In some implementations, first pass 502 and second pass 504 can each include one or more program/verify loops having different program voltages, for example, using ISPP. In some implementations, the program voltage difference (i.e., first programming voltage step) between two consecutive program voltages of the ISPP for first pass 502 (i.e., first ISPP) can be the same as or different from the program voltage difference (i.e., second programming voltage step) between two consecutive program voltages of the ISPP for second pass 504 (i.e., second ISPP). In some implementations, the first programming voltage step can be larger than the second programming voltage step.

In some implementations, to perform a multi-pass program operation to write one of $2^N$ pieces of N-bits data into a target memory cell 106, the target memory cell 106 is first programmed into one of $2^N-1$, rather than $2^N$, intermediate threshold voltage ranges (i.e., a first set of $2^N-1$ threshold voltage ranges $$\left\{P_1^0, P_1^1, \ldots, P_1^{2^N-2}\right\})$$

in the first pass 502. Then, in second pass 504, target memory cell 106 is further programmed into one of $2^N$ threshold voltage ranges (i.e., a second set of $2^N$ threshold voltage ranges $$\left\{P_2^0, P_2^1, \ldots, P_2^{2^N-1}\right\}.$$

Each threshold voltage ranges $$P_j^i$$

corresponds to (and can also be referred to as) an ith level or state of target memory cell 106 after the $j^{th}$ pass of the multi-pass program operation. FIG. 5 shows example threshold voltage ranges of $$\left\{P_1^0, P_1^1, \ldots, P_1^{2^N-2}\right\} \text{ and } \left\{P_2^0, P_2^1, \ldots, P_2^{2^N-1}\right\}$$

for N=4. N can be another integer value.

In some implementations, the intermediate threshold voltage range of target memory cell 106 in each programmed state $$(\text{e.g., } P_1^i, \text{ for } i = 1, \ldots, 2^N-2)$$

in the first set of $2^N-1$ threshold voltage ranges $$\left\{P_1^0, P_1^1, \ldots, P_1^{2^N-2}\right\}$$

corresponds to a respective threshold voltage range $$(\text{e.g., } P_2^{i+1})$$

in the second set of $2^N$ threshold voltage ranges $$\left\{P_2^0, P_2^1, \ldots, P_2^{2^N-1}\right\}.$$

In some implementations, $$P_1^i$$

is shifted up to $$P_2^{i+1}$$

in terms of voltage values in that the lowest voltage value in $$P_2^{i+1}$$

is no less than the lowest voltage value in $$P_1^i.$$

For example, as shown in FIG. 5, $$P_1^1$$

is shifted up to $$P_2^2, P_1^2$$

is shifted up to $$P_2^3,$$

and so on until $$P_1^{2^N-2}$$

is shifted up to $$P_2^{2^N-1}.$$

Additionally, intermediate threshold voltage range $$P_1^0$$

of the target memory 106 in an erased state corresponds to threshold voltage range $$P_2^0$$

of target memory cell 106 in an erased state, such that during second pass 504, a target memory cell 106 can be programmed into $$P_2^0$$

based on $$P_1^0.$$

Intermediate Threshold voltage range $$P_1^0$$

of the target memory cell 106 in an erased state is also shifted up to threshold voltage range $$P_2^1$$

of the target memory cell 106 in a programmed state, such that during second pass 504, target memory cell 106 can be programmed into $$P_2^1$$

based on $$P_1^0.$$

The second set of $2^N$ threshold voltage ranges $$\left\{ P_2^0, P_2^1, \dots, P_2^{2^N-1} \right\}$$

corresponds to the $2^N$ pieces of N-bits data respectively, for example according to the example mapping described with respect to FIG. 4 or another mapping.

In some implementations, a threshold voltage within $$P_1^1$$

is higher than or equal to a threshold voltage within $$P_2^1.$$

In some implementations, a threshold voltage within $$P_1^{2^N-2}$$

is lower than a threshold voltage within $$P_2^{2^N-1}.$$

Figure 6:
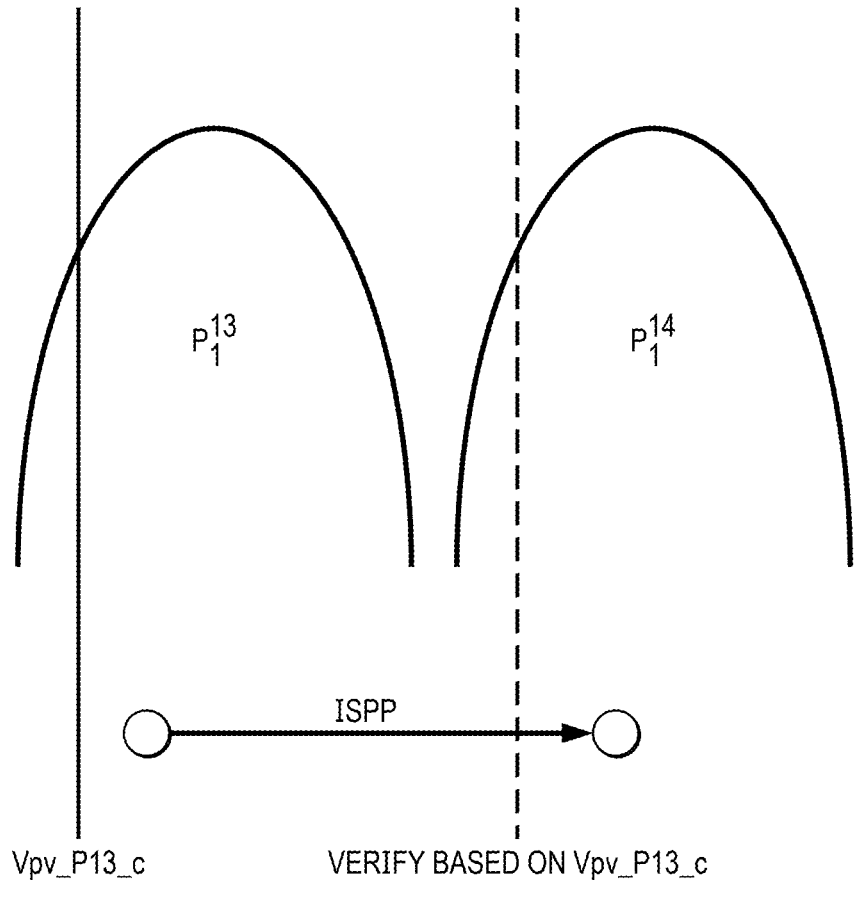
FIG. 6 illustrates an example verify scheme associated with a highest intermediate threshold voltage range during the multi-pass program operation shown in FIG. 5, according to some aspects of the present disclosure.

FIG. 6 illustrates an example verify scheme associated with a highest intermediate threshold voltage range during the multi-pass program operation shown in FIG. 5, according to some aspects of the present disclosure.

In some implementations, during first pass 502 of the multi-pass program operation shown in FIG. 5, the verify voltage may not increase from the second highest program state to the highest program state. For example, the highest intermediate threshold voltage range $$P_1^{2^N-2}$$

and the second-highest intermediate threshold voltage range $$P_1^{2^N-3}$$

of the $2^N-1$ intermediate threshold voltage ranges can share the same verify voltage. In some cases, $$P_1^{2^N-2} \text{ and } P_1^{2^N-3}$$

can share the same bit line voltage.

In some implementations, $$P_1^{2^N-2} \text{ and } P_1^{2^N-3}$$

share a verity operation. For example, once target memory cell 106 belonging to $$P_1^{2^N-2}$$

is verified to be within the second-highest intermediate threshold voltage range $$P_1^{2^N-3}$$

of the $2^N-1$ intermediate threshold voltage ranges using a verify voltage $$\left(\text{i.e., } V_1^{2^N-3}\right),$$

for example, Vpv_P13_c in FIG. 6, one or more final programming pulses in first pass 502 are applied to the selected word line 118 coupled to target memory cell 106 to raise the threshold voltage of target memory cell 106 from the second-highest intermediate threshold voltage range $$P_1^{2^N-3}$$

into the highest intermediate threshold voltage range $$P_1^{2^N-2}.$$

Then an inhibit voltage is applied to bit line 116 coupled to target memory cell 106 to inhibit an additional programming operation to be performed on $$P_1^{2^N-2}.$$

Therefore, the verification that target memory cell 106 is within the second-highest intermediate threshold voltage range $$P_1^{2^N-3}$$

of the $2^N-1$ intermediate threshold voltage ranges also serves as the verification that, after the one or more final programming pulses in first pass 502 are applied to the selected word line 118 coupled to target memory cell 106 to raise the threshold voltage of target memory cell 106 into $$P_1^{2^N-2},$$

target memory cell 106 is within the highest intermediate threshold voltage range $$P_1^{2^N-2}$$

of first pass 502. Because $$P_1^{2^N-2} \text{ and } P_1^{2^N-3}$$

share a verify operation, verify pulses that would have been applied to verify whether target memory cell 106 is within $$P_1^{2^N-2}$$

can be saved. In some implementations, the magnitude of each of the one or more final programming pulses in first pass 502 is determined based on $$P_1^{2^N-3} \text{ and } P_1^{2^N-2}.$$

For example, the difference between the voltages of two of the one or more final programming pulses in first pass 502 can be an ISPP step.

In some implementations, during second pass 504 of the multi-pass program operation, the highest threshold voltage range $$P_2^{2^N-1}$$

and the second-highest threshold voltage range $$P_2^{2^N-2}$$

of the $2^N$ threshold voltage ranges $$\left\{P_2^0, P_2^1, \ldots, P_2^{2^N-1}\right\}$$

have separate verify operations. For example, once target memory cell 106 is verified to be within the second-highest threshold voltage range $$P_2^{2^N-2}$$

of the $2^N$ threshold voltage ranges $$\left\{P_2^0, P_2^1, \ldots, P_2^{2^N-1}\right\}$$

using a verify voltage $$V_2^{2^N-2},$$

a last programming pulse in second pass 504 is applied to the selected word line 118 coupled to target memory cell 106 to raise the threshold voltage of target memory cell 106 from the second-highest threshold voltage range $$P_2^{2^N-2}$$

into the highest threshold voltage range $$P_2^{2^N-1}.$$

Next a verify operation if performed using a verify voltage $$V_2^{2^N-1}$$

to verify that target memory cell 106 is within the highest threshold voltage range $$P_2^{2^N-1}$$

of the $2^N$ threshold voltage ranges $$\left\{P_2^0, P_2^1, \ldots, P_2^{2^N-1}\right\}.$$

Then an inhibit voltage is applied to bit line 116 coupled to target memory cell 106 to inhibit any additional program operations to be performed on target memory cell 106.

In some implementations, during second pass 504 of the multi-pass program operation, the highest threshold voltage range $$P_2^{2^N-1}$$

and the second-highest threshold voltage range $$P_2^{2^N-2}$$

of the $2^N$ threshold voltage ranges $$\left\{P_2^0, P_2^1, \ldots, P_2^{2^N-1}\right\}$$

share a verify operation. For example, once target memory cell 106 belonging to $$P_2^{2^N-1}$$

is verified to be with the second-highest threshold voltage range $$P_2^{2^N-2}$$

of the $2^N$ threshold voltage ranges $$\left\{P_2^0, P_2^1, \ldots, P_2^{2^N-1}\right\}$$

using a verify voltage $$V_2^{2^N-2},$$

one or more final programming pulses in second pass 504 are applied to the selected word line 118 coupled to target memory cell 106 to raise the threshold voltage of target memory cell 106 from the second-highest threshold voltage range $$P_2^{2^N-2}$$

into the highest threshold voltage range $$P_2^{2^N-1}.$$

Then an inhibit voltage is applied to bit line 116 coupled to target memory cell 106 to inhibit an additional programming operation to be performed on target memory cell 106. Therefore, the verification that target memory cell 106 is within the second-highest threshold voltage range $$P_2^{2^N-2}$$

of the $2^N$ threshold voltage ranges $$\left\{P_2^0, P_2^1, \ldots, P_2^{2^N-1}\right\}$$

also serves as the verification that, after the one or more final programming pulses in second pass 504 are applied to the selected word line 118 coupled to target memory cell 106 to raise the threshold voltage of target memory cell 106 into $$P_2^{2^N-1},$$

target memory cell 106 is within the highest threshold voltage range $$P_2^{2^N-1}.$$

Because $$P_2^{2^N-1} \text{ and } P_2^{2^N-2}$$

share a verify operation, verify pulses that would have been applied to verify that target memory cell 106 is within $$P_2^{2^N-1}$$

can be saved. In some implementations, the magnitude of each of the one or more final programming pulses in second pass 504 is determined based on $$P_2^{2^N-2} \text{ and } P_2^{2^N-1}.$$

For example, the difference between the voltages of two of the one or more final programming pulses in second pass 504 can be an ISPP step.

FIG. 7 is a flow chart of an example process 700 for reducing verify operation time in a memory device, according to some aspects of the present disclosure. Process 700 can be performed by any suitable device or system as described herein, for example, according to the example techniques described with respect to FIGS. 5-6. For example, process 700 can be performed by a memory device, such as memory device 100. The memory device can include a memory cell array, such as, memory cell array 101, and a peripheral circuit 102. The memory device can be a part of a memory system, such as memory system 802. The operations shown in process 700 may not be exhaustive and that other operations can be performed as well before, after, or in between any of the illustrated operations. Further, some of the operations may be performed simultaneously, or in a different order than shown in FIG. 7. In some implementations, some of the operations may be performed by or one or more components of a device or a system, such as, a peripheral circuit of the memory device.

At 702, based on one of $2^N$ pieces of N-bits data to be stored in a target memory cell in a memory cell array, a first programming operation of the target memory cell is performed to program the target memory cell into an intermediate threshold voltage range $$P_1^I$$

of a first set of $2^N-1$ threshold voltage ranges $$\{P_1^0, P_1^1, \ldots, P_1^{2^N-2}\},$$

where N is an integer greater than 1, and a highest threshold voltage range $$P_1^{2^N-2}$$

and a second-highest threshold voltage range $$P_1^{2^N-3}$$

of the first set of $2^N-1$ threshold voltage ranges share a same verify voltage.

At 704, based on the one of 2 pieces of N-bits data and the intermediate threshold voltage range $$P_1^I,$$

a second programming operation of the target memory cell is performed to program the target memory cell into one of a second set of $2^N$ threshold voltage ranges $$\{P_2^0, P_2^1, \ldots, P_2^{2^N-1}\},$$

where the second set of $2^N$ threshold voltage ranges $$\{P_2^0, P_2^1, \ldots, P_2^{2^N-1}\}$$

correspond to the $2^N$ pieces of N-bits data respectively, and the lowest threshold voltage range $$P_1^0$$

of the first set of $2^N-1$ threshold voltage ranges corresponds to a lowest threshold voltage range $$P_2^0$$

and a second-lowest threshold voltage range $$P_2^1$$

of the second set of $2^N$ threshold voltage ranges.

In some implementations, the intermediate threshold voltage range $$P_1^I$$

is a lowest threshold voltage range $$P_1^0$$

of the first set of $2^N-1$ threshold voltage ranges $$\{P_1^0, P_1^1, \dots, P_1^{2^N-2}\},$$

and performing, based on the intermediate threshold voltage range $$P_1^I,$$

operation of the target memory cell to program the target memory cell into one of a second set of $2^N$ threshold voltage ranges $$\{P_2^0, P_2^1, \dots, P_2^{2^N-1}\}$$

includes performing, based on the intermediate threshold voltage range $$P_1^I,$$

the second programming operation of the target memory cell to program the target memory cell into the second-lowest threshold voltage range $$P_2^1$$

set of $2^N$ threshold voltage ranges $$\{P_2^0, P_2^1, \dots, P_2^{2^N-1}\}.$$

In some implementations, the intermediate threshold voltage range $$P_1^I$$

is a lowest threshold voltage range $$P_1^0$$

or the first set of $2^N-1$ threshold voltage ranges $$\{P_1^0, P_1^1, \dots, P_1^{2^N-2}\},$$

performing, based on the intermediate threshold voltage range $$P_1^I,$$

the second programming operation of the target memory cell to program the target memory cell into one of a second set of $2^N$ threshold voltage ranges $$\{P_2^0, P_2^1, \dots, P_2^{2^N-1}\}$$

includes performing, based on the intermediate threshold voltage range $$P_1^I,$$

the second programming operation of the target memory cell to program the target memory cell into the lowest threshold voltage range $$P_2^0$$

of the second $2^N$ threshold voltage ranges $$\{P_2^0, P_2^1, \dots, P_2^{2^N-1}\},$$

and both the lowest threshold voltage range $$P_1^0$$

the first set of $2^N-1$ threshold voltage ranges $$\{P_1^0, P_1^1, \dots, P_1^{2^N-2}\}$$

and the lowest threshold voltage range $$P_2^0$$

of the second set of $2^N$ threshold voltage ranges correspond to an erased state of the target memory cell.
In some implementations, $$\{P_1^1, P_1^2, \dots, P_1^{2^N-2}\}$$

35

36 of the first set of $2^N-1$ threshold voltage ranges corresponds to $$\left\{ P_2^2, P_2^3, \ldots, P_2^{2^N-1} \right\}$$

of the second set of $2^N$ threshold voltage ranges respectively. For example, $$P_1^i$$

corresponds to $$P_2^{i+1},$$

for i=1, 4, . . . , $2^N-2$.

In some implementations, performing the first programming operation includes performing a first incremental step pulse programming (ISPP) based on a first programming voltage step, the intermediate threshold voltage range $$P_1^I$$

to the highest threshold voltage range $$P_1^{2^N-2}$$

of the first set of $2^N-1$ threshold voltage ranges $$\left\{ P_1^0, P_1^1, \ldots, P_1^{2^N-2} \right\},$$

and process 700 includes verifying the target memory cell is within the highest threshold voltage range $$P_1^{2^N-2}$$

of the first set of $2^N-1$ threshold voltage ranges $$\left\{ P_1^0, P_1^1, \ldots, P_1^{2^N-2} \right\}$$

using a verify voltage $$V_1^{2^N-3},$$

and in response to verifying the target memory cell is within the highest threshold voltage range $$P_1^{2^N-2}$$

of the first set of $2^N-1$ threshold voltage ranges $$\left\{ P_1^0, P_1^1, \ldots, P_1^{2^N-2} \right\}$$

voltage $$V_1^{2^N-3},$$

applying a programming pulse in the first ISPP to a word line coupled to the target memory cell, and applying an inhibit voltage to a bit line coupled to the target memory cell to inhibit an additional programming operation on the target memory cell.

In some implementations, applying the programming pulse in the first ISPP to the word line coupled to the target memory cell includes applying the programming pulse with the first programming voltage step based on a difference between the highest threshold voltage range $$P_1^{2^N-2}$$

and the second-highest threshold voltage range $$P_1^{2^N-3}$$

in the first ISPP to the word line coupled to the target memory cell.

In some implementations, performing the second programming operation includes performing a second ISPP based on a second programming voltage step that is smaller than the first programming voltage step, and performing the second ISPP to program the target memory cell into the highest threshold voltage range $$P_2^{2^N-1}$$

of the second set of $2^N$ threshold voltage ranges $$\left\{ P_2^0, P_2^1, \ldots, P_2^{2^N-1} \right\}$$

includes applying a programming pulse in the second ISPP to a word line coupled to the target memory cell, and applying a second inhibit voltage to the bit line coupled to the target memory cell to inhibit another programming operation on the target memory cell.

In some implementations, N=2, 3, 4, 5 or another integer number.

In some implementations, a threshold voltage within $$P_1^1$$

is higher than or equal to a threshold voltage within $$P_2^1.$$

In some implementations, a threshold voltage within $$P_1^{2^{N-2}}$$

is lower than a threshold voltage within $$P_2^{2^{N-1}}.$$

Figure 8:
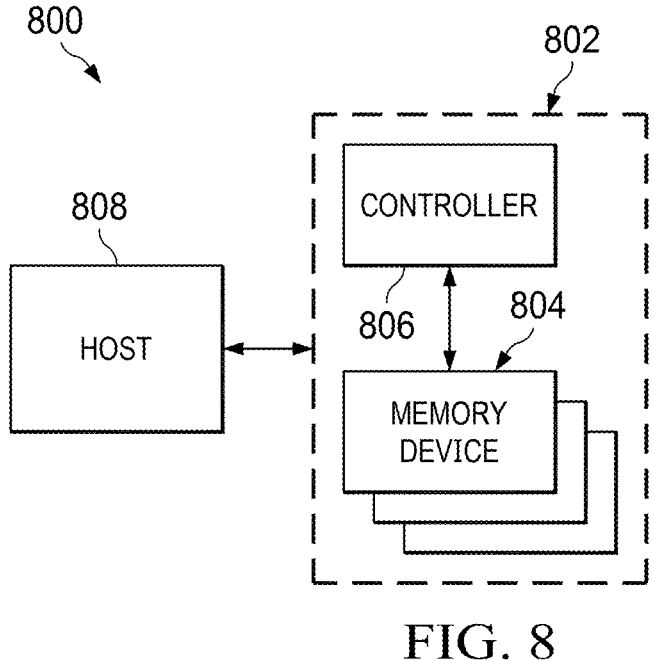
FIG. 8 illustrates a block diagram of an example system having a memory device, according to some aspects of the present disclosure.

FIG. 8 illustrates a block diagram of an example system 800 having a memory device, according to some aspects of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 8, system 800 can include a host 808 and a memory system 802 having one or more memory devices 804 and a memory controller 806. Host 808 can be a processor of an electronic device, such as a central processing unit (CPU), or a system-on-chip (SoC), such as an application processor (AP). Host 808 can be configured to send or receive data to or from memory devices 804.

Memory device 804 can be any memory device disclosed in the present disclosure. Memory controller 806 is coupled to memory device 804 and host 808 and is configured to control memory device 804, according to some implementations. Memory controller 806 can manage the data stored in memory device 804 and communicate with host 808. In some implementations, memory controller 806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 806 can be configured to control operations of memory device 804, such as read, erase, and program operations. Memory controller 806 can also be configured to manage various functions with respect to the data stored or to be stored in memory device 804 including, but not limited to bad-block management, garbage collection, logical-to-physical address conversion, wear leveling, etc. In some implementations, memory controller 806 is further configured to process error correction codes (ECCs) with respect to the data read from or written to memory device 804. Any other suitable functions may be performed by memory controller 806 as well, for example, formatting memory device 804.

Memory controller 806 can communicate with an external device (e.g., host 808) according to a particular communication protocol. For example, memory controller 806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 9A:
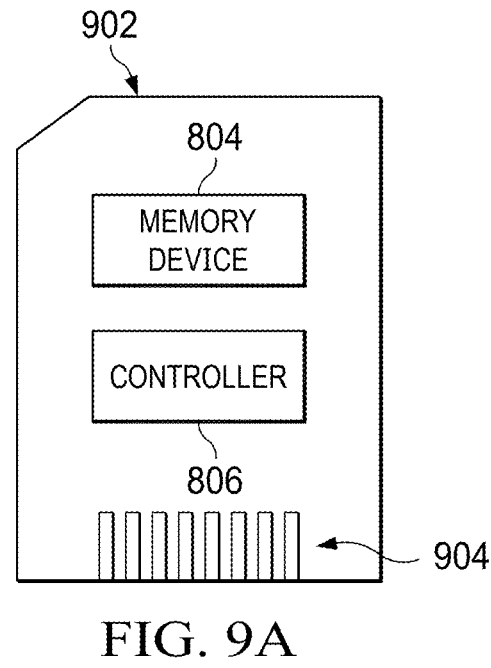
FIG. 9A illustrates a diagram of a memory card having a memory device, according to some aspects of the present disclosure.
Figure 9B:
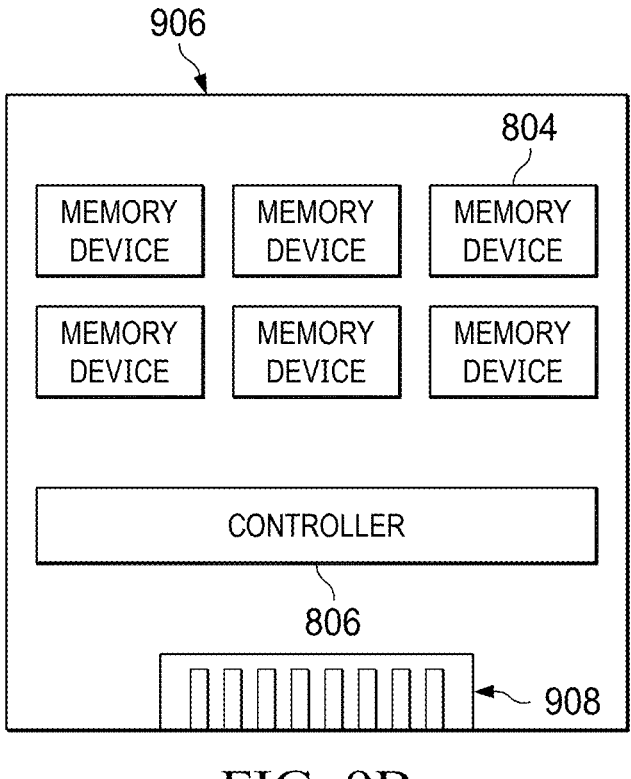
FIG. 9B illustrates a diagram of a solid-state drive (SSD) having a memory device, according to some aspects of the present disclosure.

Memory controller 806 and one or more memory devices 804 can be integrated into various types of storage devices, for example, be included in the same package, such as a universal Flash storage (UFS) package or an cMMC package. That is, memory system 802 can be implemented and packaged into different types of end electronic products. In one example shown in FIG. 9A, memory controller 806 and a single memory device 804 may be integrated into a memory card 902. Memory card 902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 902 can further include a memory card connector 904 coupling memory card 902 with a host (e.g., host 808 in FIG. 8). In another example shown in FIG. 9B, memory controller 806 and multiple memory devices 804 may be integrated into an SSD 906. SSD 906 can further include an SSD connector 908 coupling SSD 906 with a host (e.g., host 808 in FIG. 8). In some implementations, the storage capacity and/or the operation speed of SSD 906 is greater than those of memory card 902.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any subcombination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multi-tasking or parallel processing (or a combination of multi-tasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A method, comprising:

performing, based on one of $2^N$ pieces of N-bits data to be stored in a target memory cell in a memory cell array, a first programming operation of the target memory cell to program the target memory cell into an intermediate threshold voltage range $$P_1^I$$

of a first set of $2^N-1$ threshold voltage ranges $$\{P_1^0, P_1^1, \dots, P_1^{2^N-2}\},$$

wherein N is an integer greater than 1, and a highest threshold voltage range $$P_1^{2^N-2}$$

and the second-highest threshold voltage range $$P_1^{2^N-3}$$

of the first set of $2^N-1$ threshold voltage ranges share a same verify voltage; and performing, based on the one of $2^N$ pieces of N-bits data and the intermediate threshold voltage range $$P_1^I,$$

a second programming operation of the target memory cell to program the target memory cell into one of a second set of $2^N$ threshold voltage ranges $$\{P_2^0, P_2^1, \dots, P_2^{2^N-1}\},$$

wherein the second set of $2^N$ threshold voltage ranges $$\{P_2^0, P_2^1, \dots, P_2^{2^N-1}\}$$

correspond to the $2^N$ pieces of N-bits data respectively, and the lowest threshold voltage range $$P_1^0$$

of the first set of $2^N-1$ threshold voltage ranges corresponds to a lowest threshold voltage range $$P_2^0$$

and a second-lowest threshold voltage range $$P_2^1$$

of the second set of $2^N$ threshold voltage ranges.

2. The method according to claim 1, wherein the intermediate threshold voltage range $$P_1^I$$

is a lowest threshold voltage range $$P_1^0$$

of the first set of $2^N-1$ voltage ranges $$\left\{P_1^0, P_1^1, \dots, P_1^{2^{N}-2}\right\},$$

and wherein performing, based on the intermediate threshold voltage range $$P_1^I,$$

the second programming operation of the target memory cell to program the target memory cell into one of a second set of $2^N$ threshold voltage ranges $$\left\{P_2^0, P_2^1, \dots, P_2^{2^{N}-1}\right\}$$

comprises performing, based on the intermediate threshold voltage range $$P_1^I,$$

the second programming operation of the target memory cell to program the target memory cell into the second-lowest threshold voltage range $$P_2^1$$

of the second set of $2^N$ threshold voltage ranges $$\left\{P_2^0, P_2^1, \dots, P_2^{2^{N}-1}\right\}.$$

3. The method according to claim 1, wherein the intermediate threshold voltage range $$P_1^I$$

is a lowest threshold voltage range $$P_1^0$$

of the first set of $2^N-1$ threshold voltage ranges $$\left\{P_1^0, P_1^1, \dots, P_1^{2^{N}-2}\right\},$$

wherein performing, based on the intermediate threshold voltage range $$P_1^I,$$

the second programming operation of the target memory cell to program the target memory cell into one of a second set of $2^N$ threshold voltage ranges $$\left\{P_2^0, P_2^1, \dots, P_2^{2^{N}-1}\right\}$$

comprises performing, based on the intermediate threshold voltage range $$P_1^I,$$

the second programming operation of the target memory cell to program the target memory cell into the lowest threshold voltage range $$P_2^0$$

of the second set of $2^N$ threshold voltage ranges $$\left\{P_2^0, P_2^1, \dots, P_2^{2^{N}-1}\right\},$$

and wherein both the lowest threshold voltage range $$P_1^0$$

of the first set of $2^N-1$ threshold voltage ranges $$\left\{P_1^0, P_1^1, \dots, P_1^{2^{N}-2}\right\}$$

and the lowest threshold voltage range $$P_2^0$$

of the second set of $2^N$ threshold voltage ranges correspond to an erased state of the target memory cell.

4. The method according to claim 1, wherein $$\left\{P_1^1, P_1^2, \dots, P_1^{2^{N}-2}\right\}$$

of the first set of $2^N-1$ threshold voltage ranges corresponds to $$\left\{P_2^2, P_2^3, \dots, P_2^{2^{N}-1}\right\}$$

of the second set of $2^N$ threshold voltage ranges respectively.

5. The method according to claim 1, wherein performing the first programming operation comprises performing a first incremental step pulse programming (ISPP) based on a first programming voltage step, wherein the intermediate threshold voltage range $$P_1^I$$

is the highest threshold voltage range $$P_1^{2^N-2}$$

of the first set of $2^N-1$ threshold voltage ranges $$\left\{P_1^0, P_1^1, \dots, P_1^{2^N-2}\right\},$$

and wherein the method comprises:
    verifying the target memory cell is within the highest threshold voltage range $$P_1^{2^N-2}$$

of the first set of $2^N-1$ threshold voltage ranges $$\left\{P_1^0, P_1^1, \dots, P_1^{2^N-2}\right\}$$

using to verify voltage $$V_1^{2^N-3};$$

and
    in response to verifying the target memory cell is within the highest threshold voltage range $$P_1^{2^N-2}$$

of the first set of $2^N-1$ threshold voltage ranges $$\left\{P_1^0, P_1^1, \dots, P_1^{2^N-2}\right\}$$

using the verify voltage $$V_1^{2^N-3}:$$

applying a programming pulse in the first ISPP to a word line coupled to the target memory cell; and
        applying an inhibit voltage to a bit line coupled to the target memory cell to inhibit an additional programming operation on the target memory cell.

6. The method according to claim 5, wherein applying the programming pulse in the first ISPP to the word line coupled to the target memory cell comprises applying the programming pulse with the first programming voltage step based on a difference between the highest threshold voltage range $$P_1^{2^N-2}$$

and the second-highest threshold voltage range $$P_1^{2^N-3}$$

in the first ISPP to the word line coupled to the target memory cell.

7. The method according to claim 5, wherein performing the second programming operation comprises performing a second ISPP based on a second programming voltage step that is smaller than the first programming voltage step, and wherein performing the second ISPP to program the target memory cell into the highest threshold voltage range $$P_2^{2^N-1}$$

of the second set of $2^N$ threshold voltage ranges $$\left\{P_2^0, P_2^1, \dots, P_2^{2^N-2}\right\}$$

comprises:
    applying a programming pulse in the second ISPP to a word line coupled to the target memory cell; and
    applying a second inhibit voltage to the bit line coupled to the target memory cell to inhibit another programming operation on the target memory cell.

8. The method according to claim 1, wherein N=4.

9. The method according to claim 1, wherein a threshold voltage within $$P_1^1$$

is higher than or equal to a threshold voltage within $$P_2^1.$$

10. The method according to claim 1, wherein a threshold voltage within $$P_1^{2^N-2}$$

is lower than a threshold voltage within $$P_2^{2^N-1}.$$

45

11. A memory device, comprising:

a memory cell array; and a peripheral circuit coupled to the memory cell array and configured to perform operations comprising:

performing, based on one of $2^N$ pieces of N-bits data to be stored in a target memory cell in the memory cell array, a first programming operation of the target memory cell to program the target memory cell into an intermediate threshold voltage range $$P_1^I$$

of the first set of $2^N-1$ threshold voltage ranges $$\left\{P_1^0, P_1^1, \ldots, P_1^{2^N-2}\right\},$$

wherein N is an integer greater than 1, and a highest threshold voltage range $$P_1^{2^N-2}$$

and a second-highest threshold voltage range $$P_1^{2^N-3}$$

of the first set of $2^N-1$ threshold voltage ranges share a same verify voltage; and performing, based on the one of $2^N$ pieces of N-bits data and the intermediate threshold voltage range $$P_1^I,$$

a second programming operation of the target memory cell to program the target memory cell into one of a second set of $2^N$ threshold voltage ranges $$\left\{P_2^0, P_2^1, \ldots, P_2^{2^N-1}\right\},$$

wherein the second set of $2^N$ threshold voltage ranges $$\left\{P_2^0, P_2^1, \ldots, P_2^{2^N-1}\right\}$$

corresponds to the $2^N$ pieces of N-bits data respectively, and the lowest threshold voltage range $$P_1^0$$

46 of the first set of $2^N-1$ threshold voltage ranges corresponds to a lowest threshold voltage range $$P_2^0$$

and a second-lowest threshold voltage range $$P_2^1$$

of the second set of $2^N$ threshold voltage ranges.

12. The memory device according to claim 11, wherein the intermediate threshold voltage range $$P_1^I$$

is a lowest threshold voltage range $$P_1^0$$

of the first set of $2^N-1$ threshold voltage ranges $$\left\{P_1^0, P_1^1, \ldots, P_1^{2^N-2}\right\},$$

and wherein performing, based on the intermediate threshold voltage range $$P_1^I,$$

the second programming operation of the target memory cell to program the target memory cell into one of a second set of $2^N$ threshold voltage ranges $$\left\{P_2^0, P_2^1, \ldots, P_2^{2^N-1}\right\}$$

comprises performing, based on the intermediate threshold voltage range $$P_1^I,$$

the second programming operation of the target memory cell to program the target memory cell into the second-lowest threshold voltage range $$P_2^1$$

of the second set of $2^N$ threshold voltage ranges $$\left\{P_2^0, P_2^1, \ldots, P_2^{2^N-1}\right\}.$$

13. The memory device according to claim 11, wherein the intermediate threshold voltage range $$P_1^I$$

is a lowest threshold voltage range $$P_1^0$$

of the first set of $2^N-1$ threshold voltage ranges $$\{P_1^0, P_1^1, \dots, P_1^{2^N-2}\},$$

wherein performing, based on the intermediate threshold voltage range $$P_1^I,$$

the second programming operation of the target memory cell to program the target memory cell into one of a second set of $2^N$ threshold voltage ranges $$\{P_2^0, P_2^1, \dots, P_2^{2^N-1}\}$$

comprises performing, based on the intermediate threshold voltage range $$P_1^I,$$

the second programming operation of the target memory cell to program the target memory cell into the lowest threshold voltage range $$P_2^0$$

of the second set of $2^N$ threshold voltage ranges $$\{P_2^0, P_2^1, \dots, P_2^{2^N-1}\},$$

and
wherein both the lowest threshold voltage range $$P_1^0$$

of the first set of $2^N-1$ threshold voltage ranges $$\{P_1^0, P_1^1, \dots, P_1^{2^N-2}\}$$

and the lowest threshold voltage range $$P_2^0$$

of the second set of $2^N$ threshold voltage ranges correspond to an erased state of the target memory cell.

14. The memory device according to claim 11, wherein $$\{P_1^1, P_1^2, \dots, P_1^{2^N-2}\}$$

of the first set of $2^N-1$ threshold voltage ranges corresponds to $$\{P_2^2, P_2^3, \dots, P_2^{2^N-1}\}$$

of the second set of $2^N$ threshold voltage ranges respectively.

15. The memory device according to claim 11, wherein performing the first programming operation comprises performing a first incremental step pulse programming (ISPP) based on a first programming voltage step, wherein the intermediate threshold voltage range $$P_1^I$$

is the highest threshold voltage range $$P_1^{2^N-2}$$

of the first set of $2^N-1$ threshold voltage ranges $$\{P_1^0, P_1^1, \dots, P_1^{2^N-2}\},$$

and wherein the operations comprise:
verifying the target memory cell is within the highest threshold voltage range $$P_1^{2^N-2}$$

of the first set of $2^N-1$ threshold voltage ranges $$\{P_1^0, P_1^1, \dots, P_1^{2^N-2}\}$$

using the verify voltage $$V_1^{2^N-3};$$

and
in response to verifying the target memory cell is within the highest threshold voltage range $$P_1^{2^N-2}$$

of the first set of $2^N-1$ threshold voltage ranges $$\{P_1^0, P_1^1, \dots , P_1^{2^N-2}\}$$

using the verify voltage $$V_1^{2^N-3}:$$

applying a programming pulse in the first ISPP to a word line coupled to the target memory cell; and
    applying an inhibit voltage to a bit line coupled to the target memory cell to inhibit an additional programming operation on the target memory cell.

16. The memory device according to claim 15, wherein applying the programming pulse in the first ISPP to the word line coupled to the target memory cell comprises applying the programming pulse with the first programming voltage step based on a difference between the highest threshold voltage range $$P_1^{2^N-2}$$

and the second highest threshold voltage range $$P_1^{2^N-3}$$

in the first ISPP to the word line coupled to the target memory cell.

17. The memory device according to claim 15, wherein performing the second programming operation comprises performing a second ISPP based on a second programming voltage step that is smaller than the first programming voltage step, and wherein performing the second ISPP to program the target memory cell into the highest threshold voltage range $$P_2^{2^N-1}$$

of the second set of $2^N$ threshold voltage ranges $$\{P_2^0, P_2^1, \dots , P_2^{2^N-1}\}$$

comprises:
    applying a programming pulse in the second ISPP to a word line coupled to the target memory cell; and
    applying a second inhibit voltage to the bit line coupled to the target memory cell to inhibit another programming operation on the target memory cell.

18. The memory device according to claim 11, wherein N=4.

19. The memory device according to claim 11, wherein a threshold voltage within $$P_1^1$$

for higher than or equal to a threshold voltage within $$P_2^1.$$

20. A memory system, comprising:
    a memory device, comprising:
      a memory cell array; and
      a peripheral circuit coupled to the memory cell array and configured to perform operations comprising:
        performing, based on one of $2^N$ pieces of N-bits data to be stored in a target memory cell in the memory cell array, a first programming operation of the target memory cell to program the target memory cell into an intermediate threshold voltage range $$P_1^I$$

of a first set of $2^N-1$ threshold voltage ranges $$\{P_1^0, P_1^1, \dots , P_1^{2^N-2}\},$$

wherein N is an integer greater than 1, and a highest threshold voltage range $$P_1^{2^N-2}$$

and a second-highest threshold voltage range $$P_1^{2^N-3}$$

of the first set of $2^N-1$ threshold voltage ranges share a same verify voltage; and
        performing, based on the one of $2^N$ pieces of N-bits data and the intermediate threshold voltage range $$P_1^I,$$

a second programming operation of the target memory cell to program the target memory cell into one of a second voltage ranges $$\{P_2^0, P_2^1, \dots , P_2^{2^N-1}\},$$

wherein the second set of $2^N$ threshold voltage ranges $$\left\{ P_2^0, P_2^1, \ldots, P_2^{2^N-1} \right\}$$

correspond to the $2^N$ pieces of N-bits data respectively, and the lowest threshold voltage range $$P_1^0$$

of the first set of $2^N-1$ threshold voltage ranges corresponds to a lowest threshold voltage $$P_2^0$$

and a second-lowest threshold voltage range $$P_2^1$$

of the second set of $2^N$ threshold voltage ranges; and
    a controller coupled to the memory device and configured to send one or more signals to the memory device to initiate the operations.

\* \* \* \* \*